United States Patent
Hashimoto et al.

(10) Patent No.: US 9,615,044 B2
(45) Date of Patent: Apr. 4, 2017

(54) IMAGING APPARATUS AND METHOD OF DRIVING THE SAME

(71) Applicant: CANON KABUSHIKI KAISHA, Tokyo (JP)

(72) Inventors: Seiji Hashimoto, Yokohama (JP); Yasushi Matsuno, Fujisawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/267,713

(22) Filed: Sep. 16, 2016

(65) Prior Publication Data

US 2017/0006247 A1    Jan. 5, 2017

Related U.S. Application Data

(62) Division of application No. 14/938,986, filed on Nov. 12, 2015, now Pat. No. 9,485,445, which is a division
(Continued)

(30) Foreign Application Priority Data

Jun. 23, 2011 (JP) ................. 2011-139457

(51) Int. Cl.
*H04N 5/376* (2011.01)
*H04N 5/357* (2011.01)
(Continued)

(52) U.S. Cl.
CPC ........... *H04N 5/3765* (2013.01); *H03M 1/56* (2013.01); *H04N 5/357* (2013.01); *H04N 5/3575* (2013.01); *H04N 5/378* (2013.01)

(58) Field of Classification Search
CPC ...... H04N 5/357; H04N 5/3575; H04N 5/378; H04N 5/335; H04N 5/374; H04N 5/37455;
(Continued)

(56) References Cited

U.S. PATENT DOCUMENTS 4,731,665 A    3/1988    Hashimoto
4,959,723 A    9/1990    Hashimoto
(Continued)

FOREIGN PATENT DOCUMENTS

JP    11-168383    6/1999
JP    2002-232291    8/2002
(Continued)

*Primary Examiner* — Michael Osinski
(74) *Attorney, Agent, or Firm* — Fitzpatrick, Cella, Harper & Scinto

(57) ABSTRACT

An imaging apparatus and a method of driving the same that can generate a digital data of a high resolution pixel signal are provided. The imaging apparatus includes: a pixel (10-1) for generating a signal by photoelectric conversion; a comparing circuit (30-1) for comparing a signal based on the pixel with a time-dependent reference signal; a counter circuit (40-1) performing a counting operating until an inversion of a magnitude relation between the signal based on the pixel and the time-dependent reference signal; and a selecting circuit (30-2) for setting a time-dependent change rate of the reference signal, according to a signal level of the signal based on the pixel.

17 Claims, 10 Drawing Sheets

Related U.S. Application Data of application No. 14/594,432, filed on Jan. 12, 2015, now Pat. No. 9,247,161, which is a division of application No. 13/480,806, filed on May 25, 2012, now Pat. No. 9,019,141.

(51) Int. Cl.
*H04N 5/378* (2011.01)
*H03M 1/56* (2006.01)

(58) Field of Classification Search
CPC ....... H04N 5/3745; H04N 5/363; H03M 1/56; H03M 1/66; H03M 1/001–1/004; H03M 1/02–1/10; H03M 1/1019; H03M 2201/2355
USPC .................................................. 341/126–129
See application file for complete search history.

(56) References Cited

U.S. PATENT DOCUMENTS

| | | |
|---|---|---|
| 5,146,339 A | 9/1992 | Shinohara |
| 6,608,582 B2 | 8/2003 | Casper |
| 6,894,627 B2 | 5/2005 | Janakiraman |
| 7,423,570 B2 | 9/2008 | Asayama |
| 7,626,532 B2 | 12/2009 | Maruyama |
| 7,741,593 B2 | 6/2010 | Iwata |
| 7,859,575 B2 | 12/2010 | Ota |
| 7,928,889 B2 | 4/2011 | Sakurai |
| 8,144,228 B2 | 3/2012 | Gelfand |
| 8,189,086 B2 | 5/2012 | Hashimoto |
| 8,804,017 B2 | 8/2014 | Sato |
| 8,922,668 B2 | 12/2014 | Ota |
| 8,941,753 B2 | 1/2015 | Hashimoto |
| 9,029,752 B2 | 5/2015 | Saito |
| 9,049,389 B2 | 6/2015 | Hashimoto |
| 9,247,161 B2 | 1/2016 | Hashimoto |
| 2003/0001762 A1 | 1/2003 | Casper |
| 2003/0189657 A1 | 10/2003 | Hammadou |
| 2005/0253942 A1 | 11/2005 | Muramatsu |
| 2006/0284999 A1 | 12/2006 | Muramatsu |
| 2008/0043128 A1 | 2/2008 | Poonnen |
| 2008/0055432 A1 | 3/2008 | Koseki |
| 2008/0136948 A1 | 6/2008 | Muramatsu |
| 2008/0192127 A1 | 8/2008 | Sakai |
| 2009/0026352 A1 | 1/2009 | Shimomura |
| 2009/0086075 A1 | 4/2009 | Saito |
| 2009/0128653 A1 | 5/2009 | Tanaka |
| 2009/0201187 A1 | 8/2009 | Asayama |
| 2009/0225211 A1 | 9/2009 | Oike |
| 2009/0310001 A1 | 12/2009 | Masuyama |
| 2009/0322903 A1 | 12/2009 | Hashimoto |
| 2009/0322922 A1 | 12/2009 | Saito |
| 2010/0033362 A1 | 2/2010 | Kitami |
| 2010/0039306 A1 | 2/2010 | Simony |
| 2010/0149394 A1 | 6/2010 | Yamazaki |
| 2010/0194949 A1 | 8/2010 | Hisamatsu |
| 2010/0231768 A1 | 9/2010 | Utsunomiya |
| 2010/0253560 A1 | 10/2010 | Kudo |
| 2010/0321532 A1 | 12/2010 | Hashimoto |
| 2011/0001039 A1 | 1/2011 | Hoshino |
| 2011/0019035 A1 | 1/2011 | Satodate |
| 2011/0025900 A1 | 2/2011 | Kondo |
| 2011/0037868 A1 | 2/2011 | Ota |
| 2011/0134295 A1 | 6/2011 | Shigeta |
| 2011/0242385 A1 | 10/2011 | Nishihara |
| 2011/0304755 A1 | 12/2011 | Kondo |
| 2012/0008028 A1 | 1/2012 | Egawa |
| 2012/0008032 A1 | 1/2012 | Kurihara |
| 2012/0019697 A1 | 1/2012 | Suzuki |
| 2013/0021493 A1 | 1/2013 | Ishibashi |
| 2013/0026343 A1 | 1/2013 | Saito |
| 2013/0193949 A1 | 8/2013 | Wakabayashi |
| 2013/0206961 A1 | 8/2013 | Ikeda |
| 2013/0229543 A1 | 9/2013 | Hashimoto |
| 2013/0256512 A1 | 10/2013 | Shioya |
| 2013/0258132 A1 | 10/2013 | Hashimoto |
| 2013/0271633 A1 | 10/2013 | Hashimoto |
| 2013/0327925 A1 | 12/2013 | Hagihara |
| 2014/0034812 A1 | 2/2014 | Ikuma |
| 2015/0244388 A1* | 8/2015 | Hashimoto ............. H03M 1/34 348/322 |
| 2015/0304586 A1 | 10/2015 | Kishi |
| 2016/0044261 A1* | 2/2016 | Hagihara ................ H03M 1/12 348/295 |
| 2016/0255293 A1* | 9/2016 | Gesset ................... H04N 5/357 348/308 |

FOREIGN PATENT DOCUMENTS

| | | |
|---|---|---|
| JP | 2007-281987 | 10/2007 |
| JP | 2008-136043 | 6/2008 |
| JP | 2009-33305 | 2/2009 |
| JP | 2011-41091 | 2/2011 |
| WO | 2010/137244 | 12/2010 |

* cited by examiner

IMAGING APPARATUS AND METHOD OF DRIVING THE SAME

This application is a division of U.S. application Ser. No. 14/938,986, filed Nov. 12, 2015, which is a divisional of U.S. application Ser. No. 14/594,432, filed Jan. 12, 2015 (now U.S. Pat. No. 9,247,161, issued on Jan. 26, 2016), which is a divisional of U.S. application Ser. No. 13/480,806, filed May 25, 2012 (now U.S. Pat. No. 9,019,141, issued on Apr. 28, 2015), which claims benefit under §119 to Japan 2011-139457, filed on Jun. 23, 2011, the contents of each of which is incorporated by reference.

BACKGROUND OF THE INVENTION

Field of the Invention

The present invention relates to an imaging apparatus and a method of driving the same.

Description of the Related Art

Digital cameras using a CMOS image sensor as an imaging device are known. An imaging device that applies analog to digital (AD) conversion to a pixel signal is known enabling signal readout at high speed. One of the AD conversion techniques has been known in which a comparator compares a pixel signal with a time-dependent reference signal (ramp signal) and acquires an AD-converted data according to the signal amplitude. The imaging device thus including an AD converter is expected to achieve high speed reading and high resolution.

In consideration of optical shot noise of the pixel signal, only bits enough for achieving the SN ratio are necessary. According to classification into multiple signal levels, high speed readout and high resolution can be achieved by reducing the number of bits. Further, a method of combining comparators and reference signals according to signal amplitudes has been known (e.g., see Japanese Patent Application Laid-Open No. 2007-281987).

The technique of Japanese Patent Application Laid-Open No. 2007-281987 utilizes a plurality of comparators. Accordingly, there is a problem in that the response speeds are different according to variation in manufacturing elements configuring the comparators, causing an error in the AD-converted data. Furthermore, there is difficulty in increasing a circuit area and power consumption.

SUMMARY OF THE INVENTION

According to an aspect of the present invention, an imaging apparatus comprises: a pixel for generating a signal by photoelectric conversion; a comparing circuit for comparing a signal based on the pixel with a time-dependent reference signal; a counter circuit performing a counting operating until an inversion of a magnitude relation between the signal based on the pixel and the time-dependent reference signal; and a selecting circuit for setting a time-dependent change rate of the reference signal, according to a signal level of the signal based on the pixel.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

First Embodiment

Figure 1:
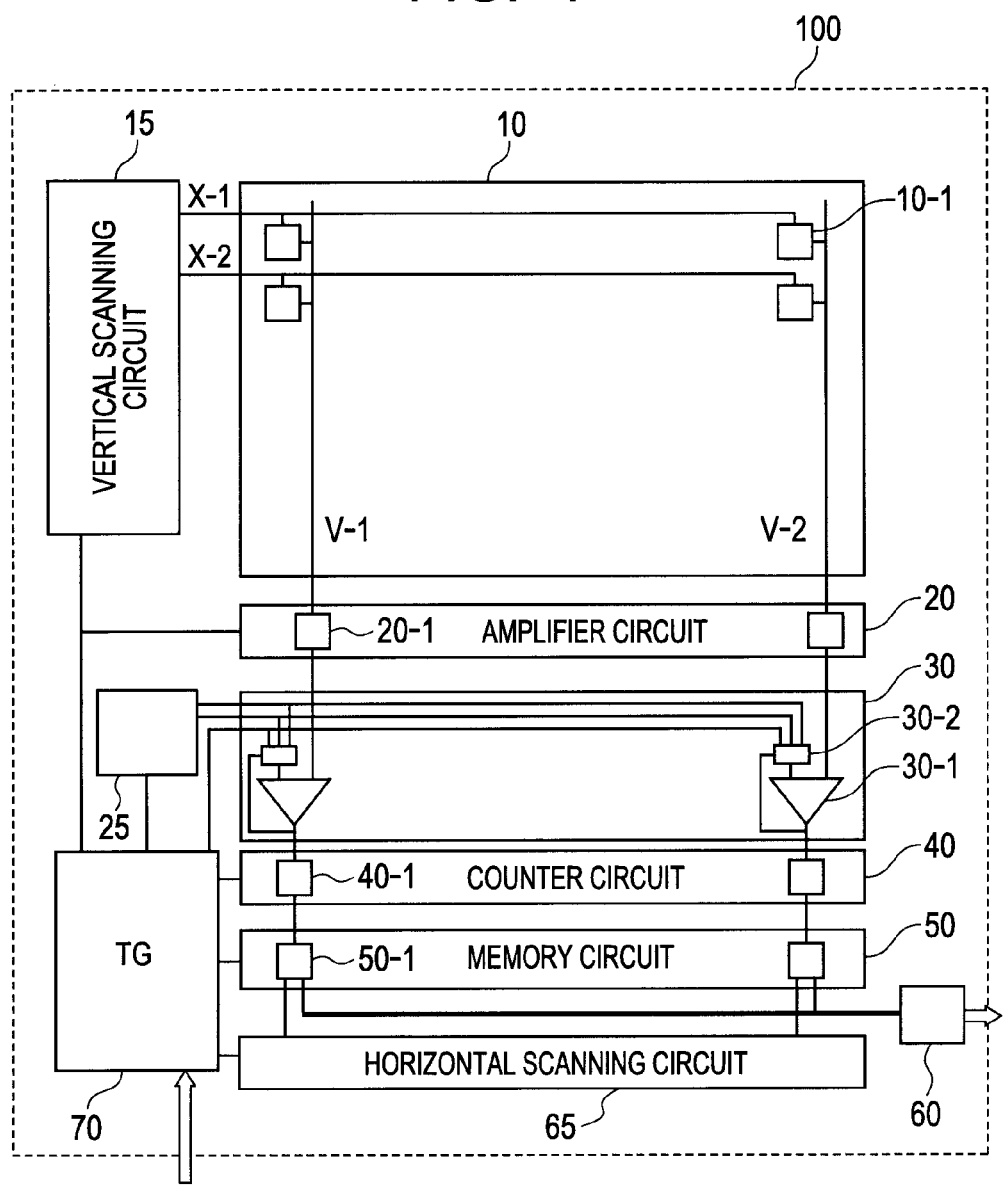
FIG. 1 is a configurational diagram of an imaging device according to a first embodiment of the present invention.

FIG. 1 is a schematic configurational diagram of an imaging device 100 of a first embodiment of the present invention. The imaging device 100 is a CMOS image sensor, photoelectric-converts a subject image formed by received light and outputs the electric signal as a digital signal. The imaging device 100 includes a pixel unit 10, a vertical scanning circuit 15, an amplifying unit 20, a ramp signal generating circuit (reference signal generating circuit) 25, a comparator unit 30, a counter unit 40, a memory unit 50, an output circuit 60, a horizontal scanning circuit 65 and a timing generation circuit (TG) 70. The pixel unit 10 includes pixels 10-1 arranged in a two-dimensional matrix. The pixel 10-1 outputs a pixel signal by photoelectric conversion. The vertical scanning circuit 15 outputs drive pulses X-1, X-2, . . . to the pixel unit 10. The amplifying unit 20 amplifies the pixel signal from the pixel unit 10. The ramp signal generating circuit 25 generates a time-dependent ramp signal (reference signal) as a comparison signal for the pixel signal. The comparator unit 30 compares the pixel signal amplified by the amplifying unit 20 with the ramp signal. The counter unit 40 counts until the comparator unit 30 outputs a comparison result. The memory unit 50 holds a count data of the counter unit 40, and performs bit-shifting and operation on the held data. The horizontal scanning circuit 65 transfers a data from memory unit 50 to the output circuit 60 by horizontal scanning. The timing generation circuit 70 controls timing of the circuit blocks.

The pixels 10-1 are arranged in an area of the pixel unit 10. However, FIG. 1 schematically illustrates only four pixels. The rows of pixels 10-1 are sequentially driven by respective drive pulses X-1, X-2 from the vertical scanning circuit 15. A reset signal (comparison signal) of each pixel 10-1 and an effective signal as a photoelectric conversion signal are guided to amplifying unit 20 via vertical output lines V-1 to V-n. Circuits, from the amplifying unit 20 to the memory unit 50, are provided for the respective vertical output lines V-1 to V-n. Each amplifying circuit 20-1 of the amplifying unit 20 may only have a function of simply amplifying the signal from the pixel 10-1. Instead, the circuit may have a CDS processing function that performs a difference process between the effective signal and the reset signal. In the case with no CDS processing function in the amplifying unit 20, the CDS process is performed in an input section of the comparator unit 30. The amplifying unit 20 is not a mandatory. However, amplification has an advantageous effect of reducing impact of noise caused in the comparator unit 30.

The comparator unit 30 includes a comparing circuit 30-1 from the amplifying unit 20 according to the pixel column, and a selecting circuit 30-2 that selects one of the ramp signals. The comparator unit 30 determines whether the amplitude of the pixel signal from the amplifying circuit 20-1 is larger or smaller than a reference comparison signal set in consideration of the SN ratio of the pixel signal, selects a ramp signal to be compared with the pixel signal according to the result, and performs a comparison process. Each comparing circuit 30-1 outputs an inversion signal, which is a comparison result compared with the selected one ramp signal, according to the determined result of the input signal amplitude. The comparator unit 30 compares the pixel signal with the ramp signal. The counter unit 40 counts counter clocks from the leading edge of the ramp signal to inversion of the output signal. The count result is held as an AD-converted data in a memory circuit 50-1 of the memory unit 50. The memory circuit 50-1 performs one of bit-shifting and operation on the AD-converted data of the reset signal and the AD-converted data of the effective signal, thereby increasing the number of bits, and transfers the processed data to the output circuit 60 according to scanning pulses from the horizontal scanning circuit 65.

As described above, the imaging device 100 causes the one comparing circuit 30-1 to perform comparison with the ramp signal according to the amplitude of the pixel signal. Accordingly, the device exerts an advantageous effect that can acquire a multiple-bit AD-converted data by an AD conversion process concerning a small number of bits.

Figure 2:
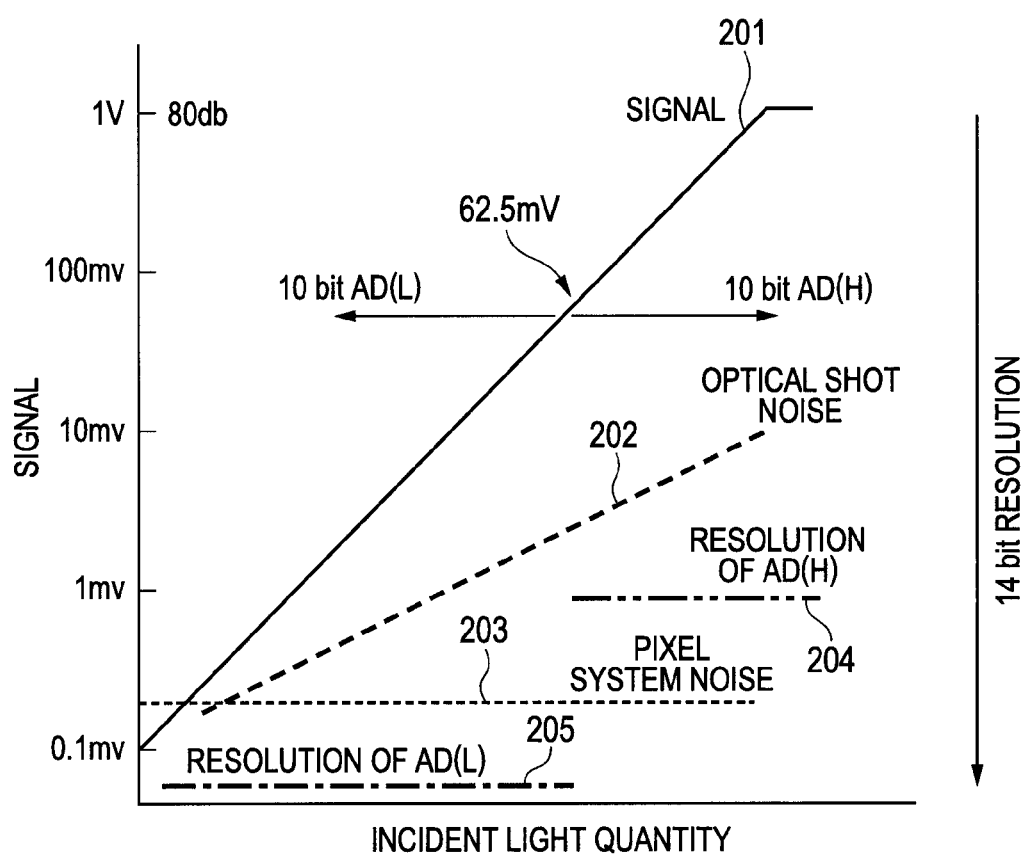
FIG. 2 is a diagram illustrating the SN ratio of a pixel signal.

FIG. 2 is a diagram illustrating the SN ratio of the pixel signal for describing an operational principle of the imaging device 100 in FIG. 1. The abscissa of FIG. 2 represents the incident light quantity onto the pixel 10-1. The ordinate indicates LOG representation of the signal level photoelectric-converted according to the incident light quantity. A solid line 201 represents a signal. It is provided that photo carriers N=10000 at a signal level of 1 V. A broken line 202 represents an optical shot noise. As known well, the amount of noise is represented as √N. The broken line 203 represents pixel system noise after CDS (including noise due to the amplifier but excluding noise due to AD conversion). Provided that the pixel system noise 203 is 0.2 mV, the SN ratio that is a ratio between the signal level of 1 V and the pixel system noise of 0.2 mV is 74 dB. AD conversion supporting this SN ratio requires a resolution about 14 bits in consideration of the quantization bit error. The higher the resolution is, the more the counter time increases. Accordingly, a certain AD conversion time is required. In the imaging device, the speed of signal readout is reduced. Resultantly, high speed imaging cannot be performed.

This embodiment thus achieves high speed readout by reducing the number of AD-converted bits. For instance, in the case of assuming that a large amplitude signal level is 1 V, the optical shot noise 202 is large. Accordingly, provided that the large amplitude signal level is 10000 charges and the optical shot noise is 100, the SN ratio is 40 dB. In the case of assuming that a small amplitude signal level is 10 mV, the SN ratio is 20 dB. That is, any point of the signal level is only required to have a resolution for securing an SN ratio of a little over 40 dB.

FIG. 2 discusses 10-bit AD conversion with classification into a large amplitude signal AD(H) and a small amplitude signal AD(L) at a boundary of 62.5 mV, which is 1/16 (corresponding to four bits) of a signal of 1 V. A chain double-dashed line 204 represents a resolution of AD conversion for a signal amplitude of 1 V. An alternate long and short dashed line 205 represents a resolution of AD conversion for a signal amplitude of 62.5 mV. Although both the two types of AD conversion have an AD conversion accuracy of 10 bits, the representation indicates that the AD resolution is small even in consideration of a quantization error in the optical shot noise 202. A 10-bit AD converter can acquire an AD-converted data having 14-bit accuracy, by bit-shifting on the two AD-converted data.

Conversion for a large amplitude signal and a small amplitude signal is according to 10 bits. In this conversion, a slope of a supplied ramp signal, which is a time-dependent change rate of the reference signal, of 16 corresponds to a change of resolution for $2^4=16$, i.e. four bits. A 14-bit resolution can be achieved for a signal range of 1 V, by combining both types having such a relationship. Here, conversion of a large amplitude signal is discussed. This embodiment determines whether the signal is a large amplitude signal or not with reference to a boundary of 1/16 of 1 V, which is the maximum value of the signal amplitude. The value is 1000 mV/16=62.5 mV. Accordingly, the boundary for determination is 62.5 mV.

On the other hand, in the conversion of a small amplitude signal, a small amplitude signal up to the boundary of 62.5 mV is AD-converted using a ramp signal having a slope of 1/16 of a ramp signal for the large amplitude signal. Accordingly, the resolution 205 of the AD conversion of a small amplitude signal is 1/16 of the resolution 204 of the AD conversion of a large amplitude signal. Accordingly, the resolution of 10-bit AD conversion for the signal amplitude of 62.5 mV is 62.5 mV/1024≅0.0612 mV. The resolution of 0.0612 mV is sufficiently small with respect to the value of 0.2 mV of the pixel system noise 203. The signal of 62.5 mV as the boundary can be dealt with as a large amplitude signal or a small amplitude signal.

Figure 3:
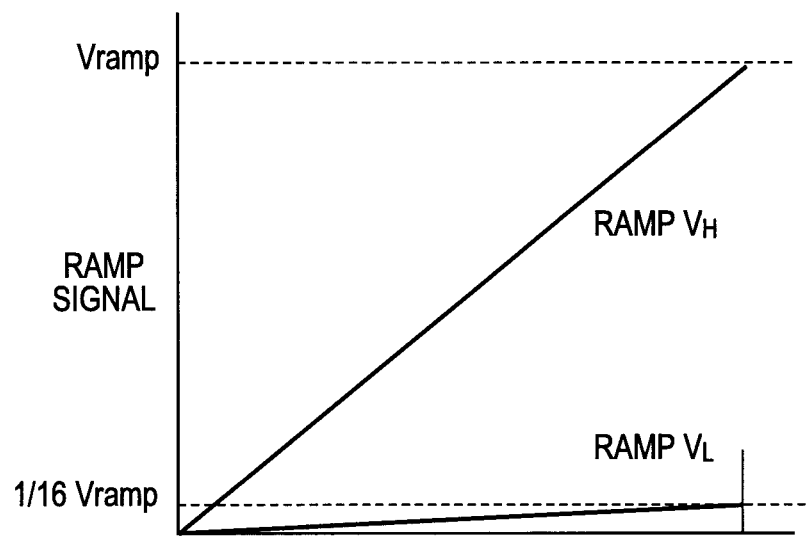
FIG. 3 is a diagram illustrating ramp signals.

FIG. 3 is a diagram illustrating ramp signals according to this embodiment. FIG. 3 illustrates a slope that represents temporal change of a ramp signal. A first ramp signal (first reference signal) VH is used for the signal amplitudes of 62.5 mV and higher in FIG. 2. A second ramp signal (second reference signal) VL is used for signals less than 62.5 mV. The second ramp signal has a smaller slope (time-dependent change rate) than the first ramp signal VH. The slope ratio of ramp signals VH and VL is 16. With the slope ratio of 16, the resolution is increased by four bits. Both the AD converting circuits adopt 10-bit conversion and identical maximum conversion time. Accordingly, the counter clock has the same clock frequency. With a slope ratio of 8, the resolution is increased by three bits. In FIG. 2, the AD-converted resolution for the small amplitude signal is sufficiently smaller than system noise. Accordingly, the resolution may be nine bits. In this case, the maximum clock frequency fmax of the counter is assigned to 10-bit AD conversion, to reduce conversion time. Accordingly, the counter clocks of the 9-bit AD converting circuit is ½×fmax. The slope ratio of the ramp signal and the resolution of the AD converting circuit are determined based on the number of saturated charges of the pixel, the system noise and the resolution required for the imaging device 100. The slope ratio of ramp signals VH and VL having different slopes may be a multiple of two. The counter unit 40 may count the ramp signals VH and VL using the counter clock having the same frequency. Instead, the count may be according to counter clocks having different frequencies.

Figure 4:
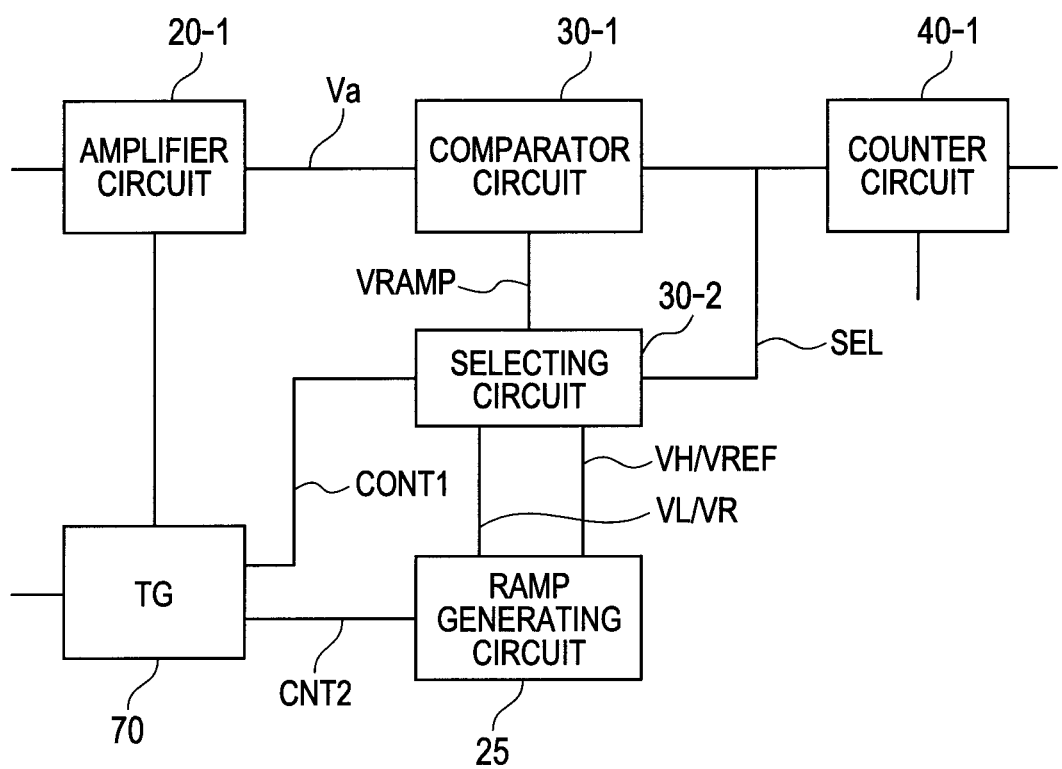
FIG. 4 is a block diagram of an AD converting unit of the first embodiment of the present invention.

FIG. 4 is a block diagram of the AD converting unit illustrating connection of the comparing circuit 30-1 to input and output circuits according to the first embodiment of the present invention. Blocks having the same functions as the blocks in FIG. 1 are assigned with the same symbols. The description is omitted. The AD converting unit can convert a photoelectric-converted analog signal into a digital signal at high speed.

Figure 11:
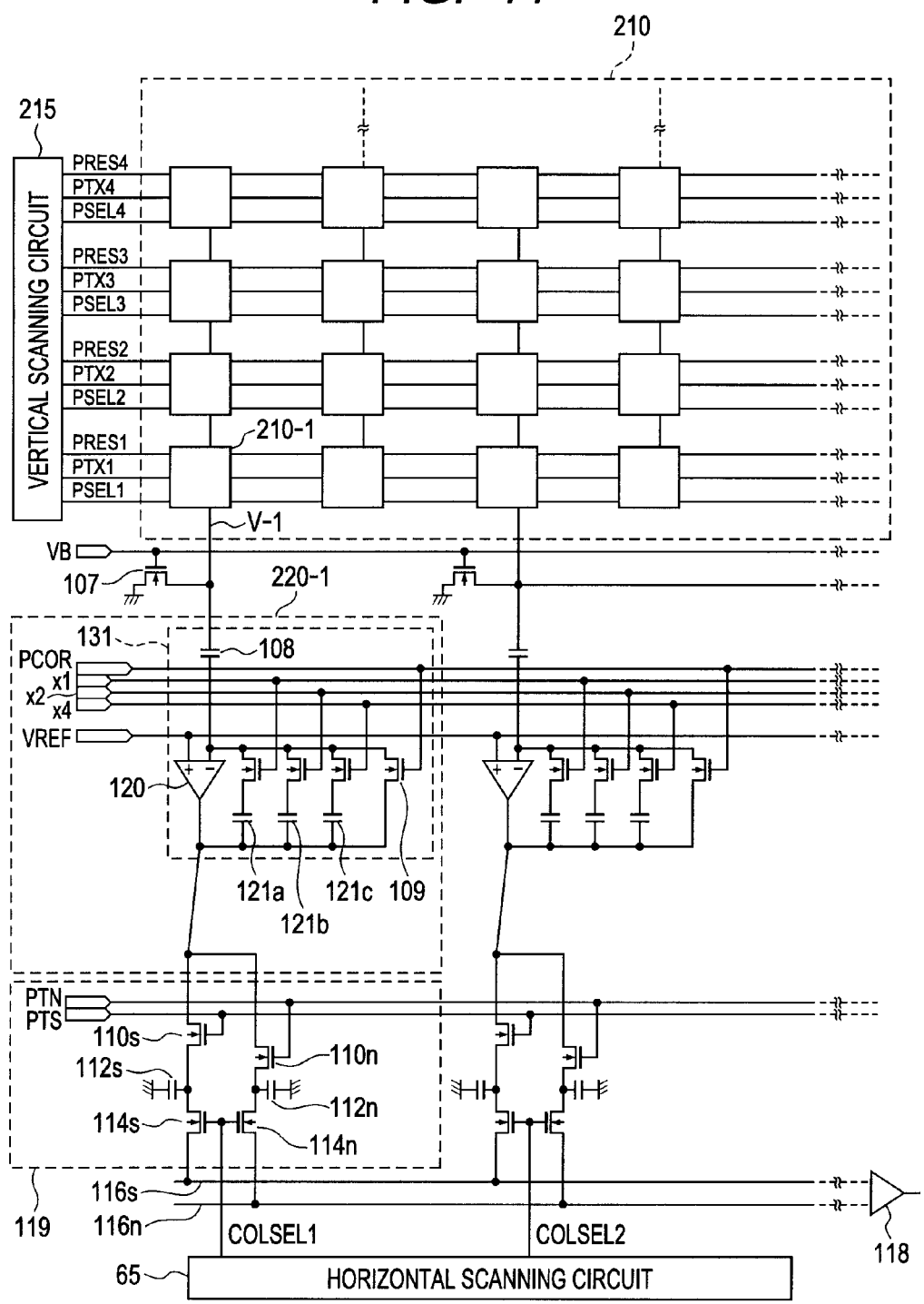
FIG. 11 is a conceptual diagram illustrating an example of a configuration of the imaging device in FIG. 1.

Next, an example of a configuration and operation of an imaging apparatus with no AD converter are described, for facilitating description of this embodiment. FIG. 11 is a diagram illustrating an example of configurations of the pixel unit 210 and the amplifying circuit 220-1 in the imaging device, where the comparator unit 30, the counter unit 40 and the memory unit 50 are omitted. A CDS circuit 119 is provided after the amplifying circuit 220-1. The pixel unit 210 includes pixels 210-1 arranged in multiple columns and multiple rows. In FIG. 11, signals output from pixels at odd columns from the left are read by reading circuits arranged below the pixel unit 210. On the other hand, signals output from pixels at even columns from the left are read by reading circuits, not illustrated, arranged above the pixel unit 210. Thus, the reading circuits are alternately arranged. Accordingly, an area for two column of the pixel unit 210 can be utilized for the layout of the reading circuit.

Figure 12:
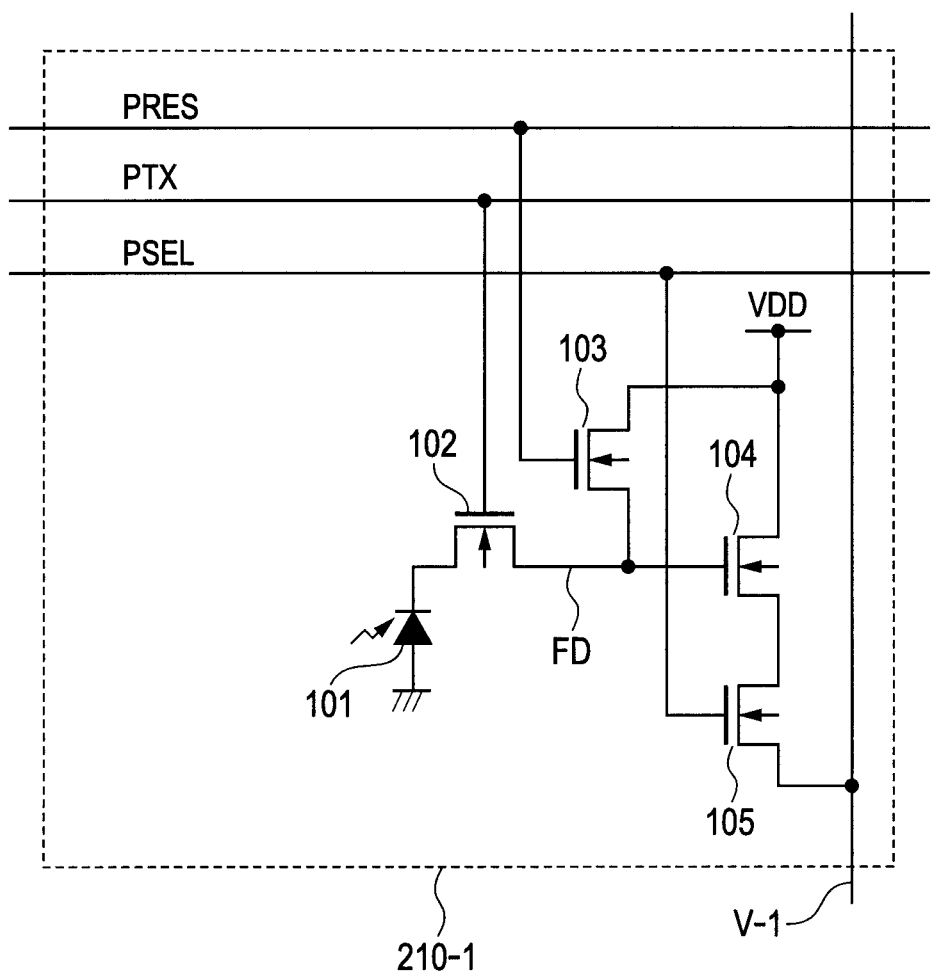
FIG. 12 is an equivalent circuit diagram of a pixel.

FIG. 12 is a circuit diagram of one pixel 210-1. A transfer switch 102 is driven by a transfer pulse PTX. A reset switch 103 is driven by a reset pulse PRES. A row selection switch 105 is driven by a row selection pulse PSEL. Representation PTX is for PTX1 to n (n is the number of rows). Representation PRES is for PRES1 to n. Representation PSEL is for PSEL1 to n.

Figure 13:
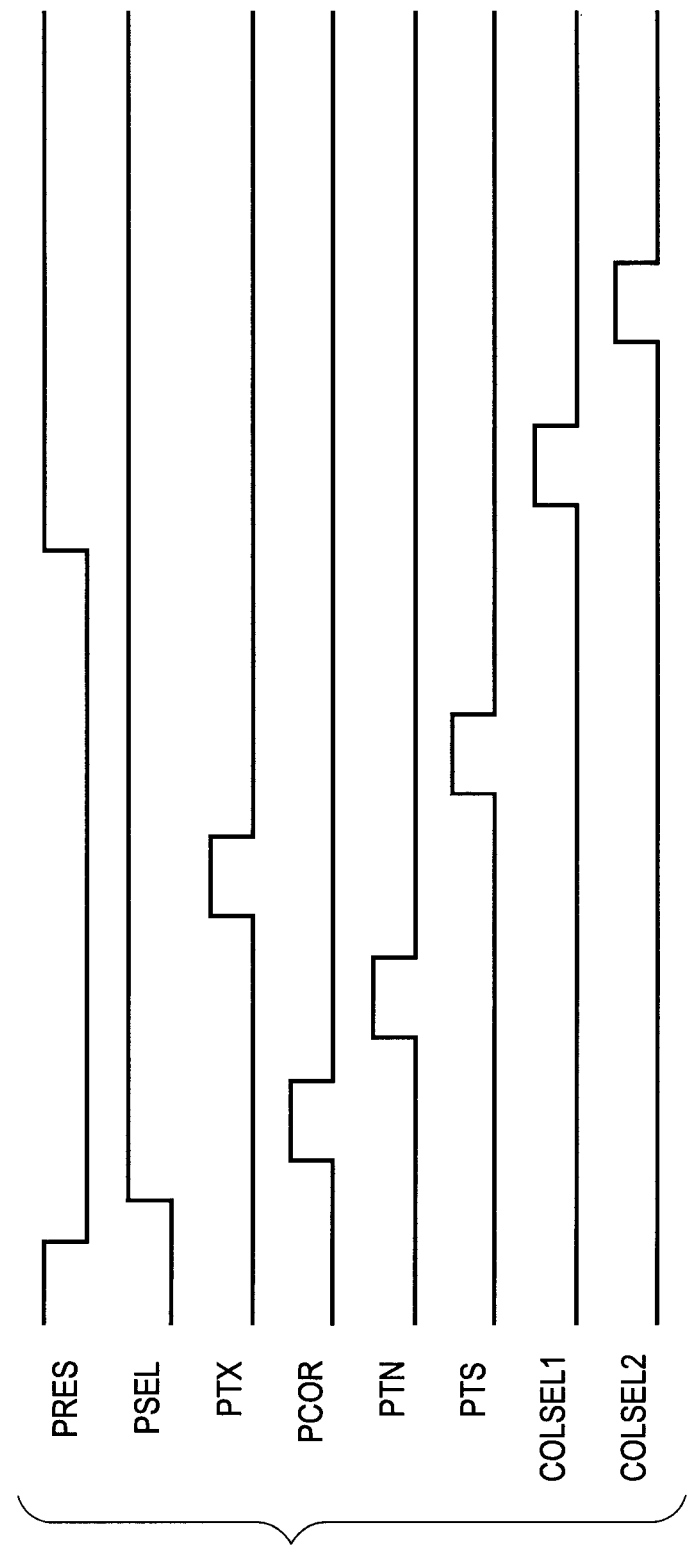
FIG. 13 is a timing chart illustrating an example of an operation of the imaging device illustrated in FIG. 11.

FIG. 13 is a timing chart illustrating an example of an operation of the imaging device illustrated in FIG. 11. Hereinafter, referring to FIGS. 11 to 13, the example of operation of the imaging device is described. The imaging device is exposed to light for a set exposure time before a reading operation. Photo carriers are accumulated in a photodiode 101. In the following description, the PRES1, PTX1 and PSEL1 output from the vertical scanning circuit 215 select a row to be driven.

First, the pixel reset pulse PRES is changed from the high level to the low level to cancel the reset of the gate electrode of an amplifier MOSFET 104. At this time, a potential corresponding to cancellation of the reset is held in a floating diffusion region FD connected to the gate electrode. Subsequently, when the row selection pulse PSEL becomes the high level, an output corresponding to the potential of the floating diffusion region FD appears at the vertical output line V-1 by a source follower circuit formed by the amplifier MOSFET 104 and a constant current source 107. In this state, a clamp pulse PC0R is activated to the high level. Accordingly, a clamp switch 109 is turned on, a variable amplifier 131 becomes in a voltage-follower state, and the electrode of a clamp capacitor 108 on a column amplifier side has a voltage substantially identical to a voltage VREF. Subsequently, the clamp pulse PC0R is inactivated from the high level to the low level, and the output on the vertical output line V-1 is clamped.

Next, an accumulated pulse PTN is activated to the high level, and an offset signal of the amplifying circuit 220-1 is stored in a holding capacitor 112n via a transfer gate 110n.

Subsequently, a transfer pulse PTX is activated to the high level. Accordingly, the transfer switch 102 becomes the high level for a certain time, and the photo carriers accumulated in the photodiode 101 are transferred to the gate electrode of the amplifier MOSFET 104. Here, the transferred charges are electrons. Provided that the absolute value of the amount of transferred charges is Q and the capacitance of the floating diffusion region FD is CFD, the gate potential decreases by Q/CFD. The potential of the vertical output line V-1 is changed accordingly. Provided that the source follower gain is Gsf, the amount of change ΔVvl of the potential Vvl of the vertical output line V-1 due to transfer of charges from the photodiode 101 to the floating diffusion unit FD is represented according to Equation (1).

$$Vvl = -Q \cdot Gsf / CFD \quad (1)$$

The potential variation ΔVvl is voltage-amplified by the variable amplifier 131 that includes an operational amplifier 120, the clamp capacitor 108 and a feedback capacitor 121. An output Vct of the variable amplifier 131 is represented according to Equation (2).

$$Vct = VREF + Q \cdot (Gsf/CFD) \cdot (C0/Cf) \quad (2)$$

Here, the clamp capacitor 108 has a capacitance C0. Feedback capacitors 121a, 121b and 121c selected when sensitivity switching pulses x1, x2 and x4 have a capacitance Cf. For instance, C0=1 pF. When the feedback capacitor 121a is selected, Cf=1 pF. When the feedback capacitor 121b is selected, Cf=0.5 pF. When the feedback capacitor 121c is selected, Cf=0.25 pF. The voltage gains represented as −C0/Cf are −1-fold, −2-fold and −4-fold. That is, in a system applying negative feedback to the operational amplifier 120, selection of any of the feedback capacitors 121a to 121c changes the feedback ratio determined by the partial pressure ratio of Cf and C0, thereby allowing the voltage gain to be switched. The negative sign of the voltage gain represents that the circuit is an inverting amplification circuit. After the transfer pulse PTX becomes the low level, the accumulated pulse PTS becomes the high level. The level of the output from the amplifying circuit 220-1 at the time is accumulated in a holding capacitor 112s via a transfer gate 110s.

Subsequently, scanning pulses COLSEL1 and COLSEL2, . . . generated by the horizontal scanning circuit 65 sequentially turn on column selection switches 114s and 114n. The signals accumulated in the holding capacitor 112s are output to a horizontal output line 116s according to the sequence of the columns. The signals accumulated in the holding capacitor 112n are output to the horizontal output line 116n in the sequence of the columns. The signal pairs of the columns are sequentially output to the horizontal output lines 116s and 116n. A difference processor 118 outputs the differences of the signal pairs output to the horizontal output lines 116s and 116n. Accordingly, noise components included in the signals held in the holding capacitor 112s can be reduced.

Figure 5:
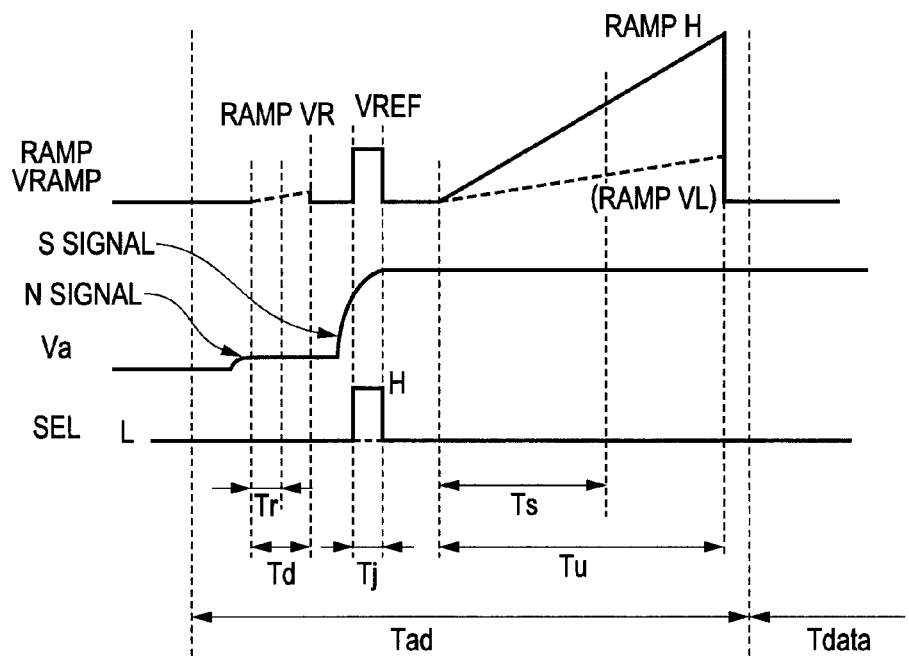
FIG. 5 is a timing chart of the AD converting unit in FIG. 4.

FIG. 5 is a timing chart illustrating a method of driving the imaging device 100 of this embodiment, and particularly, is a timing chart of the AD converting unit in FIG. 4. Hereinafter, referring to FIGS. 4 and 5, an AD converting operation is described. In FIG. 5, a time Tad is AD conversion time of the N signal and the S signal of the analog signal Va read from the pixels. A time Tdata is an AD-converted data transfer time. In the time Tad, a time Td is an N signal AD conversion time from the pixels, and a ramp signal VR is a comparison signal therefor. A time Tj is a signal level determination time for the S signal. A comparison signal VREF is a comparison signal therefore. A time Tu is an S signal AD conversion time. A ramp signal VH (or ramp signal VL) is a comparison signal therefor. An output signal Va of the amplifying circuit 20-1 mainly takes the illustrated N and S signal levels, and is guided into an input terminal of the comparing circuit 30-1. A ramp signal VRAMP, which is a comparison signal for signal Va, is input into the other input terminal of the comparing circuit 30-1. The N signal in the following description corresponds to a signal sampled by a signal PTN in FIG. 13, in the case where the CDS circuit is provided before the comparator unit 30. On the other hand, in the case with no CDS circuit, the signal corresponds to a signal output to the vertical signal line in response to reset of the floating diffusion unit. Likewise, the S signal in the following description corresponds to a signal sampled by a signal PTS in FIG. 13, in the case where the CDS circuit is provided before the comparator unit 30. On the other hand, in the case with no CDS circuit, the signal corresponds to a signal output to the vertical signal line output in response to transfer of charges caused in the photodiode to the floating diffusion unit.

The ramp signal generating circuit 25 generates a ramp signal VH/comparison signal VREF and a ramp signal VL/ramp signal VR, under control of a control signal CNT2 of the timing generation circuit 70. The ramp signal VH is for higher-order bits having a large slope. The ramp signal VL is for lower-order bits having a small slope. The comparison signal VREF is a reference comparison signal for determining the S signal level. The ramp signal VR is for comparison with the N signal. These four ramp signals are selected by the selecting circuit 30-2 under control of a control signal CNT1 of the timing generation circuit 70, and input into the comparing circuit 30-1. The timing generation circuit 70 controls the ramp signal generating circuit 25 by the control signal CNT2.

The comparing circuit 30-1 compares the N signal with the ramp signal VR in the N signal AD conversion time Td. In a time Tr, the ramp signal VR starts to change and the magnitude relation with the N signal is inverted. The counter circuit 40-1 counts, in the time Tr. The memory circuit 50-1 holds the counting value as the N signal data. The ramp signal VR has the same slope as the ramp signal VL. According to the same slope, an N signal AD-converted data with high resolution can be acquired. Next, the comparing circuit 30-1 compares the signal levels of the S signal and the comparison signal VREF with each other, in S signal level determination time Tj. According to the illustrated example, the comparing circuit 30-1 outputs to the selecting circuit 30-2 a high level selection signal SEL representing a comparison result in which the S signal is higher than the comparison signal VREF, in the S signal level determination time Tj. As a result, the selecting circuit 30-2 selects the ramp signal VH with the large slope in the S signal AD conversion time Tu, and outputs the signal to the comparing circuit 30-1. The comparing circuit 30-1 compares the S signal with the ramp signal VH, the counter circuit 40-1 performs a counting operation in time Ts in which the magnitude relation of the signals are inverted. The memory circuit 50-1 holds the counting value as the S signal AD-converted data. If the output of the comparing circuit 30-1 is not inverted in the S signal level determination time Tj, a comparison result is represented that the selection signal SEL is at the low level and the S signal level is lower than that of the comparison signal VREF; the selecting circuit 30-2 selects the ramp signal VL with the small slope as the ramp signal. In this case, the comparing circuit 30-1 compares the S signal with the ramp signal VL. The selecting circuit 30-2 selects the one of the ramp signals VH and VL having the different slopes, according to the level of the S signal amplified by the amplifying unit 20. That is, the selecting circuit 30-2 sets the time-dependent change rate of the ramp signal according to the level of the S signal based on the pixels. The comparing circuit 30-1 compares the ramp signal selected by the selecting circuit 30-2 and the S signal amplified by the amplifying unit 20 with each other. The counter circuit 40-1 counts from the time when the ramp signal starts to change to the time when the comparing circuit 30-1 outputs the signal representing inversion of the magnitude relation between the S signal and the ramp signal.

In FIG. 5, the ramp signal VR and the ramp signal VL have the same slope, as described above. In the N signal AD conversion time Td, the ramp signal VR is compared with the N signal. However, the N signal also functions as the comparison signal for the S signal, and is therefore required to have high accuracy. The ramp signal VR has the same slope as the ramp signal VL for generating the lower-order bits. Accordingly, there is an advantageous effect capable of utilizing the same ramp signal generating circuit 25. The counting result of the counter circuit 40-1 is stored in the memory unit 50. The memory unit 50 subtracts the N signal AD-converted data from the S signal AD-converted data. The subtracted data is transferred from the memory unit 50 to the output circuit 60, under control of the horizontal scanning circuit 65. This difference process removes an AD conversion error due to variation in offset of the amplifying circuit 20-1 and variation in response speed of the comparing circuit 30-1. The AD-converted data of the S signal, having been AD-converted using the ramp signal VL, is subjected to a difference operation with the N signal AD-converted data. On the other hand, the S signal AD-converted data, which has been AD-converted using the ramp signal VH and has the slope of the ramp signal different from the N signal AD-converted data, is subjected to bit-shifting by four bits and then subjected to a difference operation with the N signal AD-converted data. The main factors of variation in potential of the N signal are the N signal when the pixels are reset, the offset of the amplifying circuit 20-1, and a variational component (up to several tens of millivolts) of comparing circuit 30-1 at the initial setting. The offset component between the N signal and the amplifying circuit 20-1 is reduced in the CDS process before the comparing circuit 30-1. However, the variational component of the comparing circuit 30-1 may be considered to be the N signal AD-converted data. As a result of the differential process, the N signal is reduced. The AD-converted data of the large amplitude signal has 14 bits. However, according to the description with FIG. 6, the four least significant bits (4LSB) is smaller than the optical shot noise 202 (FIG. 2) and can therefore be regarded as a dummy data.

The gain of the amplifying circuit 20-1 in FIG. 4 is one, provided that the pixel signal from the pixel unit 10 is the signal 201 described with FIG. 2. However, an imaging system that will be described later with FIG. 10 has sensitivity setting suitable for the imaging environment. For instance, in the case of 16-fold sensitivity setting, the signal level of 62.5 mV in FIG. 2 is amplified to 1 V, and the signal is input into the comparing circuit 30-1. At this time, a resolution of 10-bit AD conversion, which compares the large amplitude signal with the ramp signal VH, is sufficient for the SN ratio required for AD conversion. Accordingly, in the case of a sensitivity setting of 16-fold or more, the selecting circuit 30-2 may perform a control so as to select the ramp signal VH according to a control signal CONT1 from the timing generation circuit 70 and to output the signal to the comparing circuit 30-1. The SN ratio of the pixel unit 10 is mainly affected by the aperture area of the pixel unit 10. Thus, the slope ratio of the ramp signal VH and the ramp signal VL and sensitivity setting for selecting the ramp signal VH are changed according to the aperture area.

Figure 6:
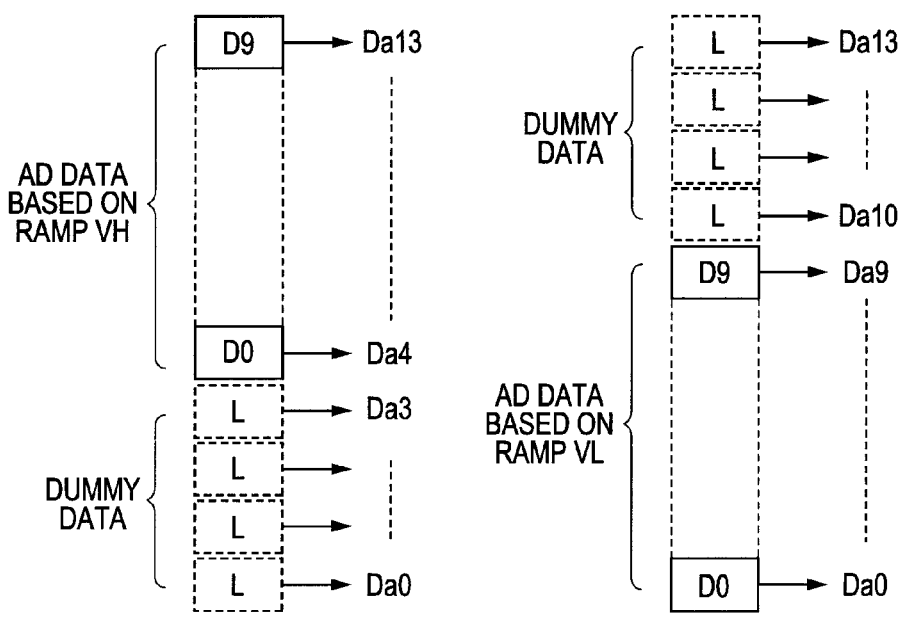
FIG. 6 is a diagram illustrating a bit-shifting unit for the AD-converted data.

FIG. 6 is a diagram illustrating a bit-shifting unit for the AD-converted data of this embodiment. For instance, the bit-shifting unit in the memory circuit 50-1 performs a bit-shifting process. The AD-converted data here is described as a data acquired by subtracting the N signal AD-converted data from the S signal AD-converted data. FIG. 6A illustrates a case where the S signal is the reference comparison signal (62.5 mV in this embodiment); the AD-converted data is a comparison result with the ramp signal VH having the large slope. The AD-converted data D0 to D9 is subjected to 4-bit-shifting and output as AD-converted data Da4 to Da13. In this case, lower-order bits at and lower than the data Da3 are smaller than the optical shot noise 202. Accordingly, a low level data is output. FIG. 6B illustrates a case where the S signal is lower than the reference comparison signal; the AD-converted data is a comparison result with the ramp signal VL having the low slope. The AD-converted data D0 to D9 are not subjected to bit-shifting, but output, as they are, as AD-converted data Da0 to Da9. In this case, signal amplitudes of bits to the data Da9 are AD-converted. Thus, the higher-order bits at and higher than the data Da10 are not at the high level. Accordingly, the data Da10 to Da13 are set to the low level. The number of types of ramp signals with different slopes may be three or more. The bit-shifting unit applies bit-shifting at least to the data D0 to D9 corresponding to the ramp signal with the largest slope.

This embodiment changes the slope of the ramp signal at the boundary of the amplitude of the S signal of 62.5 mV. Accordingly, in the case where the amplitude of the S signal is 62.5 mV or more, the 10-bit AD-converted data D0 to D9 are subjected to 4-bit-shifting. Thus, 14-bit AD-converted data Da0 to Da13 can be acquired. This embodiment has described that switching of the ramp signal is at the signal level of 62.5 mV. However, the level may be one of 65 and 70 mV. That is, any S signal is necessarily compared with one of the ramp signals VH and VL, thereby allowing the AD-converted data to be acquired. In this case, the optical shot noise 202 and the AD-converted data are different in difference of resolutions from each other. However, the resolution of AD conversion is lower than the optical shot noise 202, which does not cause a problem. As described above, as to the AD conversion accuracy, the switching signal level is not necessarily set to be the AD conversion accuracy or less. The level may have a low accuracy.

The bit-shifting unit can be provided in the imaging device, at any of sites where the data from the counter unit 40 is stored in the memory unit 50, transferred from the memory unit 50 to the output circuit 60, and output from the output circuit 60 to the outside of the imaging device 100. The bit-shifting unit may be provided outside of the imaging device 100 (e.g., in a video signal processing circuit unit 830 in FIG. 10). In this case, if a flag data for recognizing the signal determination level (selection signal SEL) for the reference comparison signal is added to the AD-converted data, any bit-shifting method can easily be supported. The AD-converted data D0 to D9 output from the counter unit 40 are output together with the flag data representing the level of the S signal.

Second Embodiment

Figure 7:
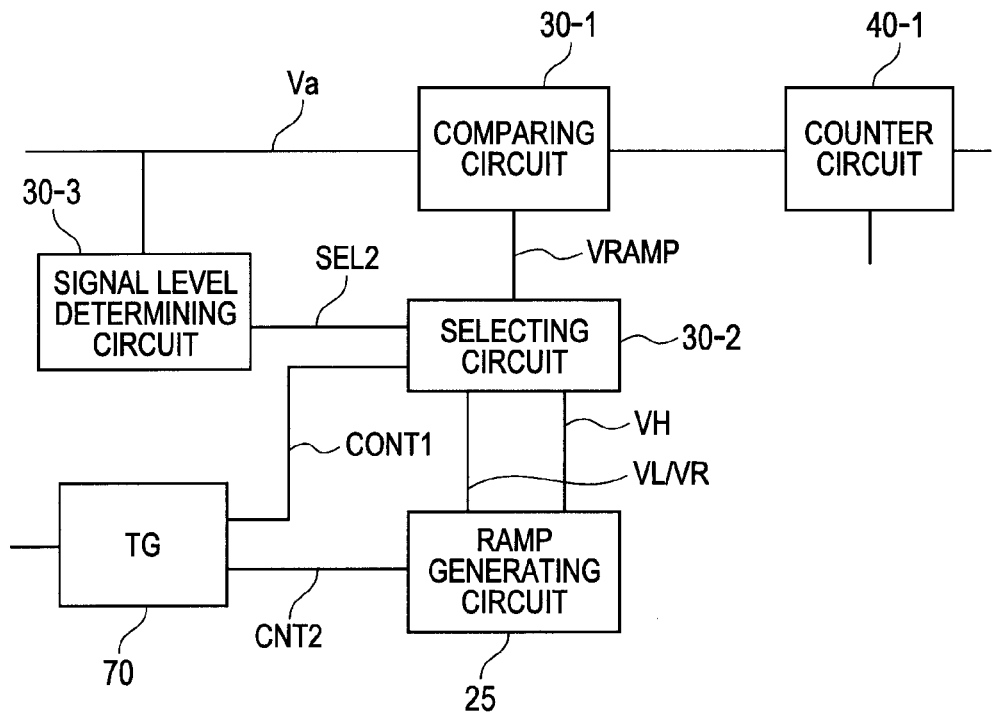
FIG. 7 is a block diagram of an AD converting unit according to a second embodiment of the present invention.

FIG. 7 is a block diagram of an AD converting unit according to a second embodiment of the present invention.

In this embodiment, the signal level is determined by a signal level determining circuit (selecting circuit) 30-3. The difference of this embodiment from the first embodiment will hereinafter be described. As with the description on the bit-shifting in FIG. 6, the ramp signal switching may be determined at a low accuracy. Accordingly, the switching is not necessarily determined by the comparing circuit 30-1. Instead, the switching may be determined by the signal level determining circuit 30-3. In this case, the ramp signal generating circuit 25 outputs the ramp signal VH and the ramp signal VL/ramp signal VR to the selecting circuit 30-2. When the S signal is higher than the comparison signal VREF, the signal level determining circuit 30-3 outputs a high level determination signal SEL2 to the selecting circuit 30-2, and the selecting circuit 30-2 outputs the ramp signal VH to the comparing circuit 30-1 based on the high level determination signal SEL2. On the other hand, when the S signal is lower than comparison signal VREF, the signal level determining circuit 30-3 outputs the low level determination signal SEL2 to the selecting circuit 30-2, and the selecting circuit 30-2 outputs the ramp signal VL to the comparing circuit 30-1 based on the low level determination signal SEL2. The comparison signal VREF is not necessary for the ramp signal VRAMP of this embodiment. Since the ramp signal generating circuit 25 does not generate the ramp signal VREF, the ramp signal generating circuit 25 can be simplified.

Third Embodiment

Figure 8:
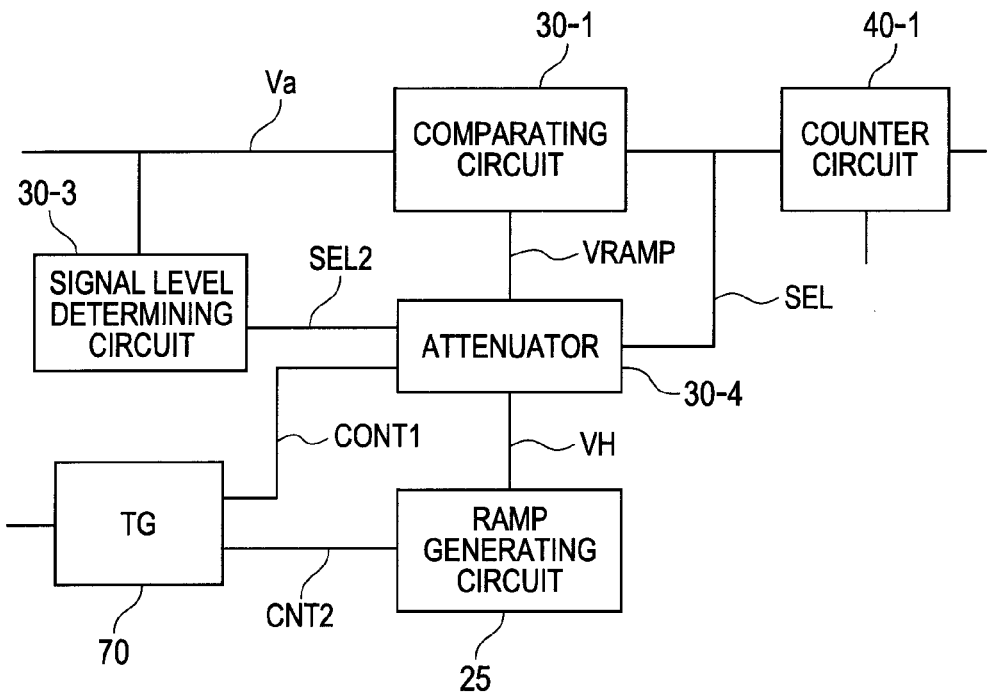
FIG. 8 is a block diagram of an AD converting unit according to a third embodiment of the present invention.

FIG. 8 is a block diagram of an AD converting unit according to the third embodiment of the present invention. The difference of this embodiment from the second embodiment will hereinafter be described. In this embodiment, the ramp signal generating circuit 25 generates the ramp signal VH and outputs the signal to an attenuator 30-4. The attenuator 30-4 attenuates the ramp signal VH generated by the ramp signal generating circuit 25, thereby generating the ramp signals VL and VR having different slopes. The attenuator 30-4 outputs one of the ramp signals VH, VL and VR to the comparing circuit 30-1 according to the control signal CONT1 and determination signal SEL2 (or the selection signal SEL). The attenuator 30-4 is thus provided, thereby exerting an advantageous effect of reducing the number of wirings from the ramp signal generating circuit 25 to the attenuator 30-4.

Figure 9:
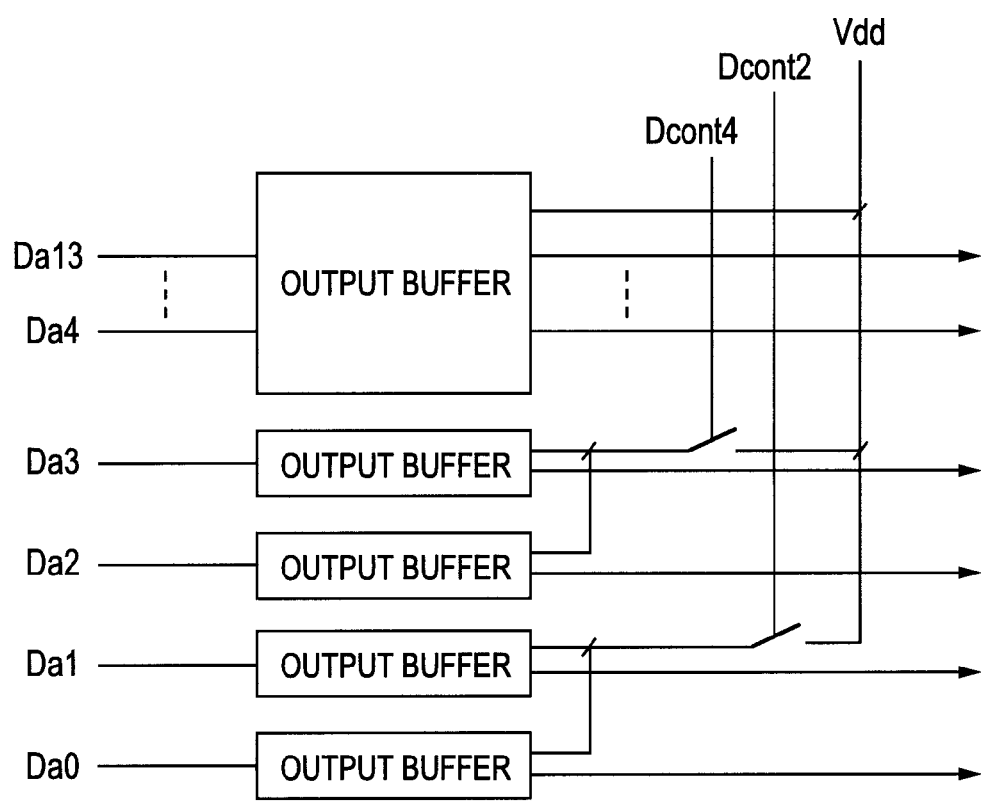
FIG. 9 is a block diagram of a bit number adjusting unit for an AD-converted data.

FIG. 9 is a block diagram of a bit number adjusting unit for the AD-converted data of this embodiment. The bit number adjusting unit includes output buffers. According to the description of the first to third embodiments, 10-bit AD-converted data D0 to D9 are subject to the bit-shifting into 14-bit AD-converted data Da0 to Da13, thereby achieving high resolution. However, in some uses of the imaging device 100, low resolution and low power consumption may be required. In the case of imaging a dark subject and amplifying the pixel signal, optical shot noise and system noise are high and the SN ratio of the signal are degraded. In this case, any of 12 and 10 bits may be adopted as the AD-converted data. The output buffers are supplied with a power source voltage Vdd, and buffer and output 14-bit data Da0 to Da13. The output buffers for the four least significant bits data Da0 to Da3 are supplied with the power source voltage Vdd by control signals Dcont2 and Dcont4. In the case where the output buffers for the four least significant bits data Da0 to Da3 are not supplied with the power source voltage Vdd by the control signals Dcont2 and Dcont4, the output buffers for the higher-order 10-bit data Da4 to Da13 output 10-bit data Da4 to Da13. On the other hand, in the case where the output buffers for the lower-2 bit data Da0 and Da1 are not supplied with the power source voltage Vdd by the control signal Dcont2, the output buffers for the higher order 12-bit data Da2 to Da13 output 12-bit data Da2 to Da13. Accordingly, any of 14, 12 and 10-bit AD-converted data can be output. The bit number adjusting unit reduces the number of bits of the data having been subjected to bit-shifting by the bit-shifting unit in FIG. 6 according to the control signals Dcont2 and Dcont4. The number of utilization bits and power consumption of the AD-converted data can be controlled by the control signals Dcont2 and Dcont4. The number of utilization bits is thus controlled, thereby exerting advantageous effects that reduce the power consumption of the imaging device 100 and the power consumption of the image signal processing of the imaging system in FIG. 10. The number of utilization bits can be controlled according to one of the gains of the amplifying unit 20 and the sensitivity setting of the imaging system in FIG. 10.

Fourth Embodiment

Figure 10:
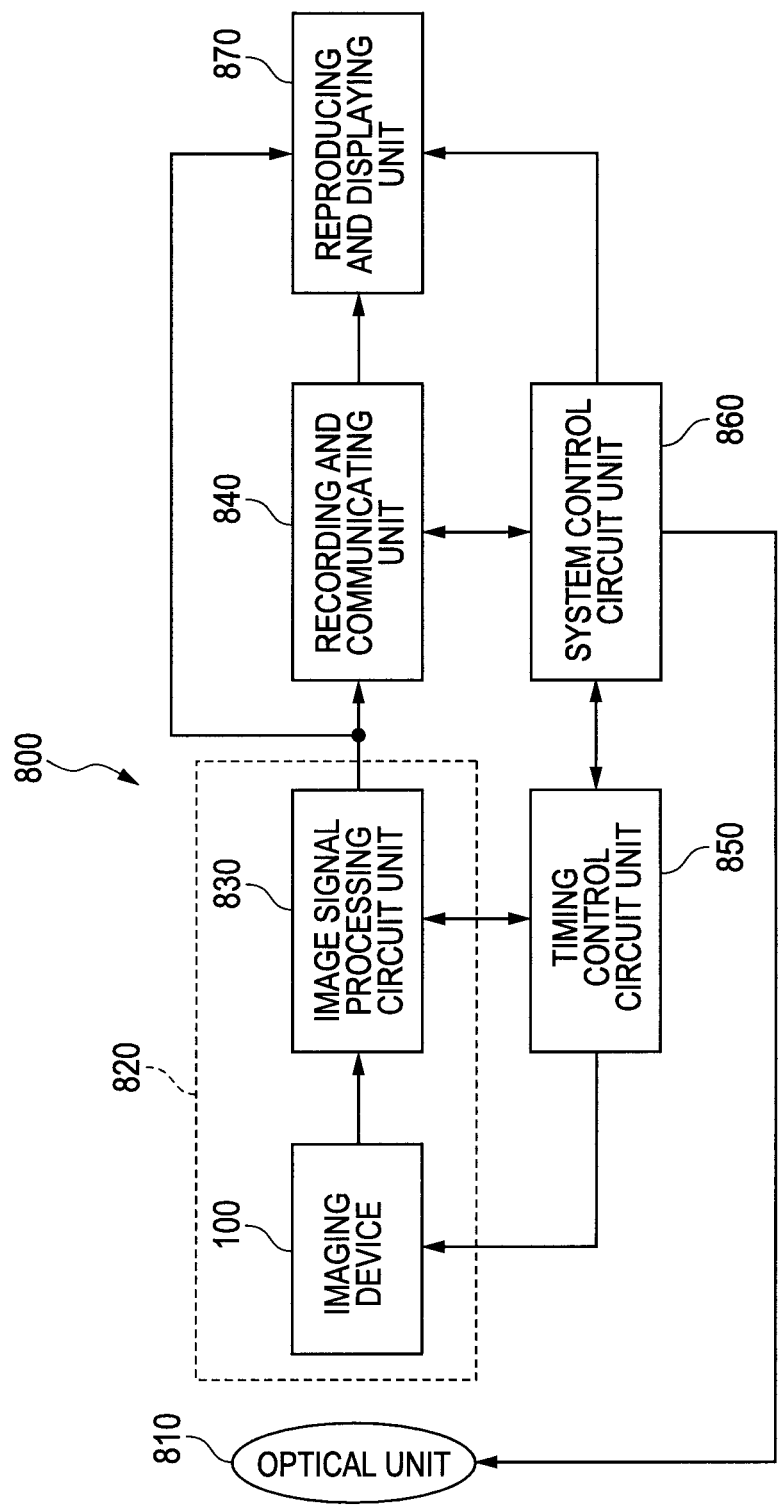
FIG. 10 is a configurational diagram of an imaging system.

FIG. 10 is a diagram illustrating an example of the configuration of an imaging system according to a fourth embodiment of the present invention. The imaging system 800 includes, for instance, an optical unit 810, the imaging device 100, a video signal processing circuit unit 830, a recording and communicating unit 840, a timing control circuit unit 850, a system control circuit unit 860 and a reproducing and displaying unit 870. An imaging apparatus 820 includes the imaging device 100 and the video signal processing circuit unit 830. The imaging device 100 used here is the same device illustrated in the embodiments.

The optical unit 810, which is an optical system such as a lens, forms an image of light from a subject on the pixel unit 10 (FIG. 1) of the imaging device 100 where the pixels are two-dimensionally arranged to form a subject image. The imaging device 100 outputs a signal according to the light formed on the pixel unit 10 at the timing based on the signal from the timing control circuit unit 850. The signal output from the imaging device 100 is input into the video signal processing circuit unit 830, which is a video signal processor. The video signal processing circuit unit 830 performs a signal processing, such as the bit-shifting process in FIG. 6, on the input signal according to a method defined by the program. The signal acquired by the process in the video signal processing circuit unit 830 is transmitted as an image data to the recording and communicating unit 840. The recording and communicating unit 840 transmits a signal for forming an image, to the reproducing and displaying unit 870, thereby causing the reproducing and displaying unit 870 to reproduce and display any of a moving image and a still image. The recording and communicating unit 840 receives the signal from the video signal processing circuit unit 830, communicates with the system control circuit unit 860, and performs an operation of recording a signal for forming an image on a recording medium, not illustrated.

The system control circuit unit 860 controls the operation of the imaging system in an integrated manner, and controls driving of the optical unit 810, the timing control circuit unit 850, the recording and communicating unit 840 and the reproducing and displaying unit 870. The system control circuit unit 860 includes a storing device, which is for instance a recording medium and not illustrated. A program required for controlling the operation of the imaging system is recorded in the medium. The system control circuit unit 860 supplies the imaging system with a signal that, for instance, switches a drive mode in response to an operation of a user. Specific examples include change of rows for reading and resetting, change of the angle of view according to electronic zooming, and shifting of the angle of view for electronic vibration isolation. The timing control circuit unit 850 controls driving timing of the imaging device 100 and the video signal processing circuit unit 830, based on control by the system control circuit unit 860 as a control unit.

Thus, the first to fourth embodiments determine whether the signal to be AD-converted has a large or small amplitude, and perform a comparison process using the ramp signal having the slope suitable for the determined signal, thereby acquiring the AD-converted data and achieving the multiple-bit configuration according to the bit-shifting process in FIG. 6. Under a dark imaging environment, in some exposure conditions, the S signal easily becomes a small amplitude signal. Thus, amplification of the S signal for improvement in sensitivity can be considered. In the first embodiment, the amplifying circuit 20-1 amplifies the signal, thereby allowing the sensitivity to be improved. In the case of inputting the signal from the pixel unit 10 into the comparing circuit 30-1 without amplification, the slope of the ramp signal can be changed to thereby improve the sensitivity as a result. The embodiments do not uniquely determine the slope of the ramp signal. Instead, the slope of the ramp signal can be changed according to required improvement in sensitivity. For instance, in the case of doubled improvement in sensitivity, the slope can be controlled to be half.

Any of the embodiments only describes an example of specific implementation of the present invention. The technical scope of the present invention shall not be construed in a limited manner according to the embodiments. That is, the present invention can be implemented in various forms without departing from the technical thought and the principal characteristics. For instance, the ramp signal whose level is changed linearly with respect to time has been described as the reference signal. However, the signal may have a stepwisely changing slope.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-139457, filed Jun. 23, 2011, which is hereby incorporated by reference herein in its entirety.

What is claimed is:

1. An imaging device comprising:
    a photoelectric-conversion unit configured to generate a charge by photoelectric conversion;
    an analog-to-digital (AD) converter; and
    a bit-shifting unit,
    wherein the AD converter comprises a comparing circuit and a selecting circuit, and
    wherein:
        the comparing circuit compares a signal based on the charge with a predetermined threshold, to output a first comparison result signal indicating a result of the comparing the signal based on the charge with the predetermined threshold to the selecting circuit,
        and when the first comparison result signal indicates that the signal based on the charge is smaller than the predetermined threshold, the selecting circuit outputs, to the comparing circuit, a first ramp signal having a voltage changing at a first time-dependent change rate, and when the first comparison result signal indicates that the signal based on the charge is larger than the predetermined threshold, the selecting circuit outputs, to the comparing circuit, a second ramp signal having a voltage changing at a second time-dependent change rate larger than the first time-dependent change rate, the comparing circuit compares the signal based on the charge with the first or second ramp signal output from the selecting circuit based on the first comparison result signal, and outputs a second comparison result signal indicating a result of the comparing the signal based on the charge with the first or second ramp signal, and based on a timing of a transition of a signal level of the second comparison result signal, the AD converter generates a digital signal corresponding to the signal based on the charge, the AD converter outputs, to the bit-shifting unit, data based on the first comparison result signal and a digital signal based on the signal based on the charge, and based on the data, the bit-shifting unit operates to perform a bit-shifting operation according to a ratio between the first and second time-dependent change rates, to at least one of:
the digital signal generated based on the comparing the signal based on the charge with the first or second ramp signal with the first ramp signal; and
the digital signal generated based on the comparing the signal based on the charge with the first or second ramp signal with the second ramp signal.

2. The imaging device according to claim 1, wherein the comparing circuit further performs comparing a noise signal with a reference signal of the first time-dependent change rate.

3. The imaging device according to claim 2, further comprising a pixel having the photoelectric-conversion unit, wherein the noise signal includes a noise of the pixel.

4. The imaging device according to claim 2, further comprising:
a pixel having the photoelectric-conversion unit; and
an amplifying circuit configured to amplify and output a signal output from the pixel,
wherein the signal based on the charge input to the comparing circuit is a signal output from the amplifying circuit, and
the noise signal is the signal output from the amplifying circuit and containing noise of the amplifying circuit.

5. The imaging device according to claim 1, wherein the comparing circuit comprises a first input terminal configured to input the signal based on the charge, and a second input terminal configured to input the first or second ramp signal output from the selecting circuit and to input the predetermined threshold.

6. The imaging device according to claim 1, further comprising:
a plurality of pixels arranged in rows and columns, each pixel having the photoelectric-conversion unit;
a plurality of the comparing circuits each arranged correspondingly to each of the columns of the pixels; and
a plurality of the selecting circuits,
wherein each of the selecting circuits is arranged correspondingly to each of the plurality of the comparing circuits.

7. The imaging device according to claim 6, further comprising a ramp signal generating circuit configured to generate the first and second ramp signals,
wherein:
the ramp signal generating circuit supplies the first ramp signal to the plurality of the selecting circuits through a first wiring,
the ramp signal generating circuit supplies the second ramp signal to the plurality of the selecting circuits through a second wiring, and
the predetermined threshold is supplied to the plurality of the selecting circuits through the first or second wiring.

8. The imaging device according to claim 1, further comprising a counter unit configured to generate a counting value based on calculation of a clock,
wherein the counting value is generated, as the digital signal based on the charge, at the timing of the transition of the signal level of the second comparison result signal.

9. The imaging device according to claim 8, further comprising a plurality of the AD converters,
wherein the counter unit having a plurality of counter circuits each generating the counting value, and
wherein each of the plurality of the AD converters has the comparing circuit and each of the plurality of counter circuits.

10. The imaging device according to claim 1, wherein the data is a flag indicating as to whether the comparing circuit performs the comparing the signal based on the charge with the first or second ramp signal with the first ramp signal, or performs the comparing the signal based on the charge with the first or second ramp signal with the second ramp signal.

11. The imaging device according to claim 1, wherein the data is the first comparison result signal.

12. The imaging device according to claim 8, wherein the bit-shifting unit operates to perform the bit-shifting operation to at least one of:
the counting value generated based on the comparing the signal based on the charge with the first or second ramp signal with the first ramp signal; and
the counting value generated based on the comparing the signal based on the charge with the first or second ramp signal with the second ramp signal.

13. The imaging device according to claim 1, wherein, based on the data, the bit-shifting unit is switched as to whether the bit-shifting operation is performed or not.

14. The imaging device according to claim 1, further comprising a bit number adjusting unit configured to reduce number of bits of data subjected to the bit-shifting operation by the bit-shifting unit.

15. The imaging device according to claim 1, further comprising a ramp signal supplying unit configured to output the second ramp signal to the selecting circuit,
wherein the selecting circuit attenuates the second ramp signal having the voltage changing in the second time-dependent change rate outputted by the ramp signal supplying unit, to generate the first ramp signal having the voltage changing in the first time-dependent change rate.

16. The imaging device according to claim 1, wherein:
a ratio of the second time-dependent change rate to the first time-dependent change rate equals 2N (N is an integer equal to 1 or more), and
the bit-shifting unit applies, by a number of N-bits, to at least one of:
the digital signal generated based on the comparing the signal based on the charge with the first or second ramp signal with the first ramp signal; and the digital signal generated based on the comparing the signal based on the charge with the first or second ramp signal with the second ramp signal.

17. An imaging apparatus comprising an imaging device and a signal processing unit configured to generate image data by processing a signal outputted from the imaging device, wherein the imaging device comprises:
  a photoelectric-conversion unit configured to generate a charge by photoelectric conversion;
  an analog-to-digital (AD) converter; and
  a bit-shifting unit,
  wherein the AD converter comprises a comparing circuit and a selecting circuit, and wherein:
  the comparing circuit compares a signal based on the charge with a predetermined threshold, to output a first comparison result signal indicating a result of the comparing the signal based on the charge with the predetermined threshold to the selecting circuit,
  and when the first comparison result signal indicates that the signal based on the charge is smaller than the predetermined threshold, the selecting circuit outputs, to the comparing circuit, a first ramp signal having a voltage changing at a first time-dependent change rate,
  and when the first comparison result signal indicates that the signal based on the charge is larger than the predetermined threshold, the selecting circuit outputs, to the comparing circuit, a second ramp signal having a voltage changing at a second time-dependent change rate larger than the first time-dependent change rate,
  the comparing circuit compares the signal based on the charge with the first or second ramp signal outputted from the selecting circuit based on the first comparison result signal, and outputs a second comparison result signal indicating a result of the comparing the signal based on the charge with the first or second ramp signal,
  and based on a timing of a transition of a signal level of the second comparison result signal, the AD converter generates a digital signal corresponding to the signal based on the charge,
  the AD converter outputs, to the bit-shifting unit, data based on the first comparison result signal and a digital signal based on the signal based on the charge, and
  based on the data, the bit-shifting unit operates to perform a bit-shifting operation according to a ratio between the first and second time-dependent change rates, to one of:
  the digital signal generated based on the comparing the signal based on the charge with the first or second ramp signal with the first ramp signal; and
  the digital signal generated based on the comparing the signal based on the charge with the first or second ramp signal with the second ramp signal.

* * * * *